(12) United States Patent
Sakaguchi

(10) Patent No.: US 6,337,030 B1
(45) Date of Patent: *Jan. 8, 2002

(54) WAFER PROCESSING APPARATUS, WAFER PROCESSING METHOD, AND SOI WAFER FABRICATION METHOD

(75) Inventor: Kiyofumi Sakaguchi, Yokohama (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/015,809

(22) Filed: Jan. 29, 1998

(30) Foreign Application Priority Data

Feb. 4, 1997 (JP) .............................. 9-021796

(51) Int. Cl.[7] .............................................. H01L 21/00
(52) U.S. Cl. ....................................... 216/91; 156/345
(58) Field of Search ........................... 156/345; 134/33; 438/747; 216/90, 91

(56) References Cited

U.S. PATENT DOCUMENTS

| | | | |
|---|---|---|---|
| 3,473,670 A | 10/1969 | Elftmann | 211/41 |
| 3,782,522 A | 1/1974 | Wyers | 198/20 R |
| 3,893,869 A | 7/1975 | Mayer et al. | 134/86 |
| 3,964,957 A | * 6/1976 | Walsh | 156/345 |
| 4,191,295 A | 3/1980 | Tams, III | 211/41 |
| 4,927,781 A | 5/1990 | Miller | 437/71 |
| 4,952,115 A | 8/1990 | Ohkase | |
| 5,191,908 A | 3/1993 | Hiroe et al. | 134/76 |
| 5,275,184 A | 1/1994 | Nishizawa et al. | 134/57 R |
| 5,327,921 A | 7/1994 | Mokuo et al. | 134/182 |
| 5,340,437 A | * 8/1994 | Erk et al. | 156/345 |
| 5,503,173 A | 4/1996 | Kudo et al. | |
| 5,520,205 A | 5/1996 | Guldi et al. | 134/98.1 |
| 5,593,505 A | * 1/1997 | Erk et al. | 134/33 |
| 5,672,212 A | * 9/1997 | Manos | 134/33 |
| 6,127,281 A | 10/2000 | Sakaguchi et al. | 438/747 |
| 6,199,563 B1 | 3/2001 | Uehara et al. | 134/25.4 |

FOREIGN PATENT DOCUMENTS

| | | |
|---|---|---|
| CA | 2206139 | 12/1997 |
| CA | 2228571 | 8/1998 |
| CA | 2229975 | 8/1998 |
| EP | 0 319 806 | 6/1989 |
| EP | 0 481 723 A1 | 4/1992 |
| EP | 0 658 923 A1 | 6/1995 |
| EP | 0 860 860 A2 | 8/1998 |
| EP | 0 938 132 A2 | 8/1999 |
| FR | 2 626 261 A1 | 7/1989 |
| JP | 61-086929 | 6/1986 |
| JP | 61-228629 | 10/1986 |
| JP | 61-247034 | 11/1986 |
| JP | 62-274730 | 11/1987 |
| JP | 62-281430 A | 12/1987 |
| JP | 01-304733 | 12/1989 |
| JP | 3-77347 | 4/1991 |
| JP | 03-231428 | 10/1991 |

(List continued on next page.)

OTHER PUBLICATIONS

Sakaguchi et al., "Extremely High Selective Etching of Porous Si for Single Etch–Stop Bond–and–Etch–Back Silicon–on–Insulator", Jpn. J. Appl. Phys. vol. 34 (1995) pp. 842–847, Part 1, No. 2B, Feb. 1995.

Primary Examiner—Thi Dang
(74) Attorney, Agent, or Firm—Morgan & Finnegan, LLP

(57) ABSTRACT

A wafer is supported while being rotated by four wafer rotating rods having grooves. The wafer rotating rods are rotated by a driving force transmitted from a motor installed outside a wafer processing bath. An ultrasonic bath is arranged below the wafer processing bath, and ultrasonic waves generated by an ultrasonic source are transmitted to the wafer processing bath. The ultrasonic waves are efficiently transmitted to the wafer because the wafer is supported only by the wafer rotating rods.

34 Claims, 9 Drawing Sheets

FOREIGN PATENT DOCUMENTS

| | | |
|---|---|---|
| JP | 03-257826 | 11/1991 |
| JP | 3-257826 | 11/1991 |
| JP | 5-55180 | 3/1993 |
| JP | 5-152277 A | 6/1993 |
| JP | 5152277 | 6/1993 |
| JP | 5-217990 | 8/1993 |
| JP | 5-335401 A | 12/1993 |
| JP | 06-011849 | 1/1994 |
| JP | 6-021030 A | 1/1994 |
| JP | 6-168928 A | 6/1994 |
| JP | 07022495 A | 1/1995 |
| JP | 7-106292 | 4/1995 |
| JP | 8-078387 A | 3/1996 |
| JP | 08-316182 | 11/1996 |
| JP | 9-010709 | 1/1997 |
| JP | 10-150013 | 6/1998 |
| KR | 90-971 | 1/1990 |
| KR | 95-10188 | 4/1995 |
| WO | 87/06862 | 11/1987 |
| WO | 92/20985 | 11/1992 |

\* cited by examiner

WAFER PROCESSING APPARATUS, WAFER PROCESSING METHOD, AND SOI WAFER FABRICATION METHOD

BACKGROUND OF THE INVENTION

FIELD OF THE INVENTION

The present invention relates to a wafer processing apparatus, a wafer processing method, and an SOI wafer fabrication method and, more particularly, to a wafer processing apparatus, a wafer processing method, and an SOI wafer fabrication method which process a wafer by dipping the wafer into a processing solution.

Wet etching is a typical example of processing performed by dipping a wafer into a solution. One subject of wet etching is to improve the in-plane uniformity. Conventionally, the in-plane uniformity is ensured by supplying fresh etching solution to the reaction surface by circulating the etching solution in a bath.

Another example of the processing performed by dipping a wafer into a solution is wafer cleaning processing. Japanese Patent Laid-Open No. 8-293478 has disclosed a wafer cleaning apparatus which increases the wafer cleaning efficiency by applying ultrasonic waves while vertically moving and rotating wafers contained in a carrier cassette in a solution by a cam mechanism.

Another example of the wafer cleaning apparatus is a cassetteless wafer cleaning apparatus. A cassetteless wafer cleaning apparatus is generally an apparatus in which rod members are arranged parallel to each other, grooves are formed in these rod members, and wafers are cleaned while being supported by these grooves. In an apparatus which cleans wafers contained in a carrier cassette, portions of the wafers in the grooves of the carrier cassette are difficult to clean. Also, since most portions of the two sides of each wafer are covered with constituent members of the carrier cassette, the cleaning solution for wafers is mostly supplied from an opening in the lower portion of the carrier cassette. This tends to result in poor cleaning. A cassetteless wafer cleaning apparatus is very effective to solve these problems. Japanese Patent Laid-Open No. 7-169731 has disclosed a cassetteless wafer cleaning apparatus capable of processing wafers of different sizes.

The wafer cleaning apparatus described in Japanese Patent Laid-Open No. 8-293478 cannot uniformly clean wafers because the strength of ultrasonic waves is made uneven by the constituent members of the carrier cassette. In this wafer cleaning apparatus, the carrier cassette is essential to prevent a fall of wafers when the wafers are rotated or vertically moved by the cam mechanism. The carrier cassette is commonly made from a resin such as PFA or PEEK, but these materials do not easily transmit ultrasonic waves. This decreases the efficiency of the cleaning processing.

Also, the wafer cleaning apparatus described in Japanese Patent Laid-Open No. 7-169731 is very effective to improve poor cleaning. However, the apparatus cannot uniformly clean wafers because the wafers are cleaned while being fixed in a bath. Additionally, since contact portions between wafer support members and wafers are fixed during cleaning, these contact portions are difficult to clean.

SUMMARY OF THE INVENTION

The present invention has been made in consideration of the above situation and has as its object to make wafer processing uniform.

A wafer processing apparatus according to the present invention is a wafer processing apparatus for processing a wafer by dipping the wafer into a processing solution, comprising a wafer processing bath, and a rotary support mechanism for supporting a wafer while rotating the wafer by a plurality of rod members arranged substantially parallel to each other.

The wafer processing apparatus preferably further comprises ultrasonic generating means for generating ultrasonic waves in the processing bath.

In the wafer processing apparatus, the rotary support mechanism preferably applies a rotating force to a wafer by rotating at least a rod member, which supports the wafer from a bottom surface side of the processing bath, of the rod members.

In the wafer processing apparatus, the rotary support member preferably applies a rotating force to a wafer by rotating the rod members in the same direction.

In the wafer processing apparatus, each rod member preferably has a groove for limiting movement of a wafer in an axial direction.

In the wafer processing apparatus, the rotary support mechanism preferably comprises driving force generating means for generating a driving force for rotating a wafer outside the processing bath.

In the wafer processing apparatus, the rotary support mechanism preferably further comprises a crank mechanism for transmitting the driving force generated by the driving force generating means to the rod members.

The wafer processing apparatus preferably further comprises a driving mechanism for rocking the rotary support mechanism in the processing bath.

The wafer processing apparatus preferably further comprises a driving mechanism for floating or dipping the rotary support mechanism.

In the wafer processing apparatus, the processing bath preferably comprises a circulating mechanism including an overflow bath.

In the wafer processing apparatus, the circulating mechanism preferably comprises means for reducing contamination of a wafer caused by particles which may be produced by the rotary support mechanism.

In the wafer processing apparatus, the ultrasonic generating means comprises an ultrasonic bath, an ultrasonic source, and an adjusting mechanism for adjusting a position of the ultrasonic source in the ultrasonic bath, and ultrasonic waves are transmitted to the processing bath via an ultrasonic transmitting medium placed in the ultrasonic bath.

In the wafer processing apparatus, at least portions of the processing bath and the rotary support mechanism, which may come into contact with a processing solution, are preferably made of a material selected from the group consisting of quartz and plastic.

In the wafer processing apparatus, at least portions of the processing bath and the rotary support mechanism, which may come into contact with a processing solution, are preferably made of a material selected from the group consisting of a fluorine resin, vinyl chloride, polyethylene, polypropylene, polybutyleneterephthalate (PBT), and polyetheretherketone (PEEK).

In the wafer processing apparatus, the rotary support mechanism preferably supports a wafer by four rod members.

In the wafer processing apparatus, the rod members are preferably arranged in a position where rotation of a wafer having an orientation flat is not prevented by the orientation flat when the wafer is processed.

A wafer processing apparatus according to the present invention is a wafer processing apparatus for processing a wafer by dipping the wafer into a processing solution, comprising a wafer processing bath, support means for supporting a wafer from both sides and below by a rod member to hold the wafer substantially perpendicular to a bottom surface of the processing bath, and driving means for rotating the supported wafer.

The wafer processing apparatus preferably further comprises ultrasonic generating means for generating ultrasonic waves in the processing bath.

In the wafer processing apparatus, the driving means preferably applies a rotating force to a wafer by rotating the rod member.

In the wafer processing apparatus, the rod member preferably has a groove for limiting movement of a wafer in an axial direction.

A wafer processing method according to the present invention is a wafer processing method of processing a wafer by dipping the wafer into a processing solution, wherein a wafer is rotated while being supported from two sides and below by a rod member, the wafer being held substantially perpendicular to a bottom surface of a processing bath.

In the wafer processing method, it is preferable that while a wafer is rotated in the processing bath, ultrasonic waves be generated in the processing solution.

The wafer processing method is suited to wafer etching by using an etching solution as the processing solution.

The wafer processing method is suited to etching of a wafer having a porous silicon layer by using an etching solution as the processing solution.

An SOI wafer fabrication method according to the present invention is an SOI wafer fabrication method of fabricating an SOI wafer by using the wafer processing method described above in a part of fabrication steps.

A wafer processing method according to the present invention processes a wafer by using the wafer processing apparatus described above.

A wafer processing method according to the present invention etches a specific layer formed on a wafer by using the wafer processing apparatus described above.

An SOI wafer fabrication method according to the present invention fabricates an SOI wafer by using the wafer processing method described above in a part of fabrication steps.

Further objects, features and advantages of the present invention will become apparent from the following detailed description of embodiments of the present invention with reference to the accompanying drawings.

DETAILED DESCRIPTION OF THE PREFERRED EMBODIMENT

Figure 1:
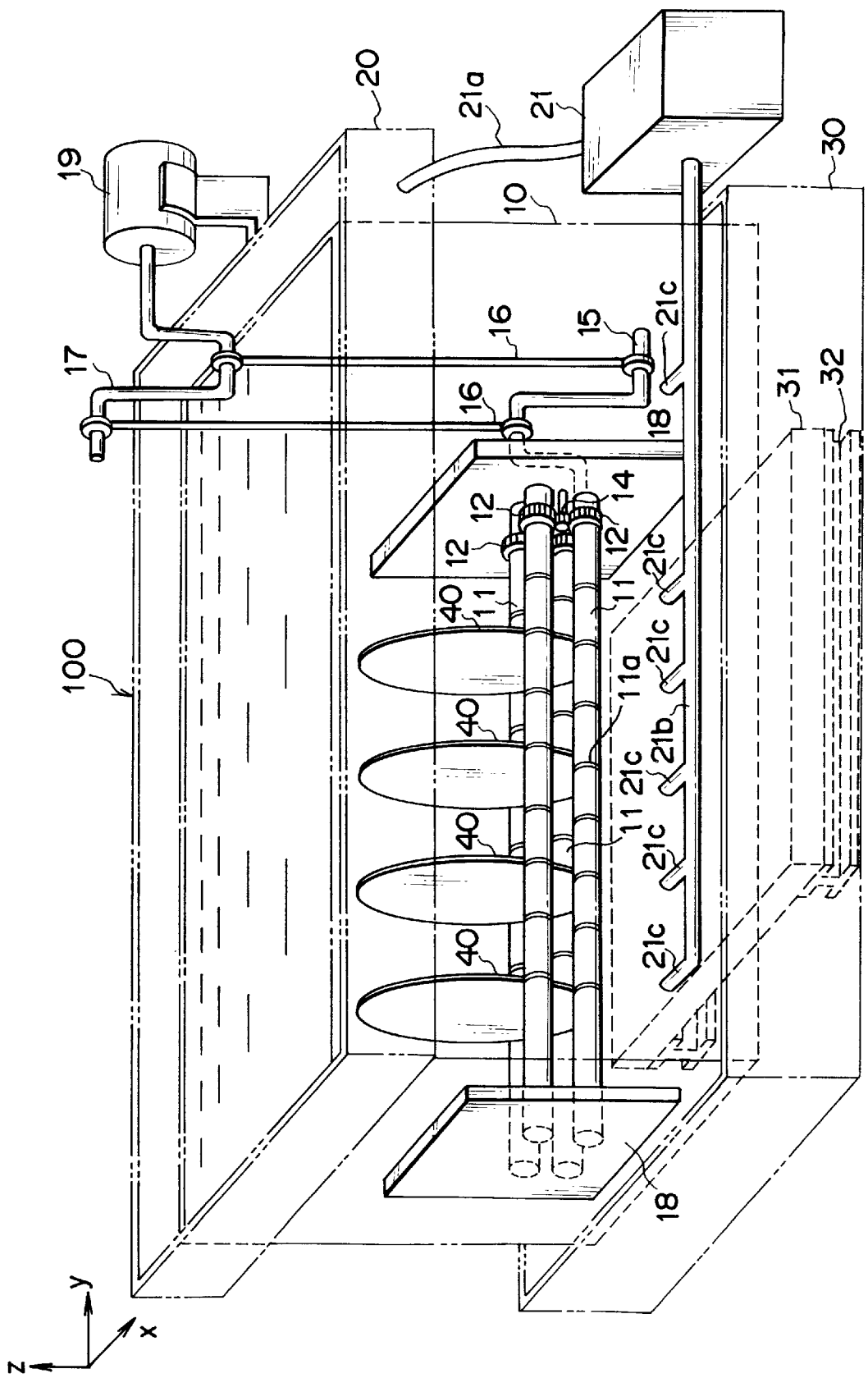
FIG. 1 is a perspective view showing an outline of the construction of a wafer processing apparatus according to a preferred embodiment of the present invention.
Figure 2:
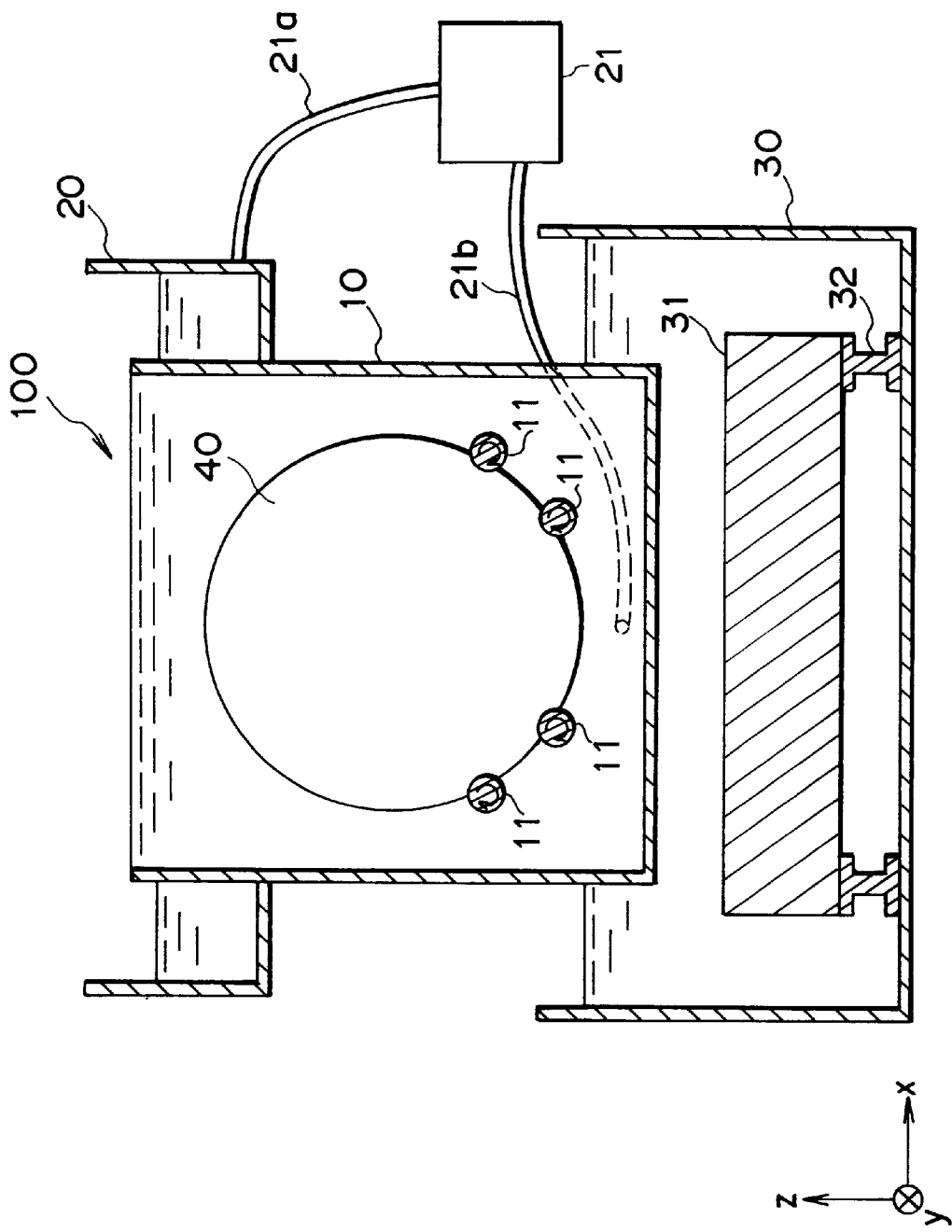
FIG. 2 is a sectional view of the wafer processing apparatus shown in FIG. 1.

A preferred embodiment of the present invention will be described below with reference to the accompanying drawings. FIG. 1 is a perspective view showing an outline of the construction of a wafer processing apparatus according to the preferred embodiment of the present invention. FIG. 2 is a sectional view of the wafer processing apparatus shown in FIG. 1.

In a wafer processing apparatus 100 according to this embodiment, portions which may come into contact with a processing solution are preferably made from quartz or plastic in accordance with the intended use. Preferable examples of the plastic are a fluorine resin, vinyl chloride, polyethylene, polypropylene, polybutyleneterephthalate (PBT), and polyetheretherketone (PEEK). Preferable examples of the fluorine resin are PVDF, PFA, and PTFE.

This wafer processing apparatus 100 has a wafer processing bath 10, an overflow bath 20, an ultrasonic bath 30, and a wafer rotating mechanism (11 to 19) for supporting wafers 40 while rotating these wafers.

To process wafers, the wafer processing bath 10 is filled with a processing solution (e.g., an etching solution or a cleaning solution). The overflow bath 20 for temporarily storing any processing solution overflowing from the wafer processing bath 10 is provided around the upper portion of the wafer processing bath 10. The processing solution temporarily stored in the overflow bath 20 is discharged from the bottom portion of the overflow bath 20 to a circulator 21 through a discharge pipe 21a. The circulator 21 removes particles by filtering the discharged processing solution and supplies the processing solution to the bottom portion of the wafer processing bath 10 through a supply pipe 21b. Consequently, particles in the wafer processing bath 10 are efficiently removed.

The wafer processing bath 10 preferably has a depth by which the wafers 40 are completely dipped. This prevents particles in the air and those gathering around the upper portion of the wafer processing bath 10 from adhering to the wafers 40.

The ultrasonic bath 30 is arranged below the wafer processing bath 10. An ultrasonic source 31 is supported by an adjusting mechanism 32 inside the ultrasonic bath 30. This adjusting mechanism 32 includes a mechanism for adjusting the vertical position of the ultrasonic source 31 and a mechanism for adjusting the horizontal position of the ultrasonic source 31, as mechanisms for adjusting the relative positional relationship between the ultrasonic source 31 and the wafer processing bath 10. By this mechanism, ultrasonic waves to be supplied to the wafer processing bath 10, more specifically, to the wafers 40 can be optimized. The ultrasonic source 31 preferably has a function of adjusting the frequency or strength of ultrasonic waves to be generated. This further optimizes the supply of ultrasonic waves.

Since the apparatus thus has the function of optimizing the supply of ultrasonic waves to the wafers 40, various types of wafers can be processed. The ultrasonic bath 30 is filled with an ultrasonic transmitting medium (e.g., water), and this ultrasonic transmitting medium transmits ultrasonic waves to the wafer processing bath 10.

The wafers 40 are held to be nearly perpendicular to the bottom surface of the wafer processing bath 10 by four wafer rotating rods 11 having grooves 11a for engaging with the wafers 40. These wafer rotating rods 11 have a function of supporting the wafers 40 while rotating them and form a part of the wafer rotating mechanism. The wafer rotating rods 11 are rotatably supported by a pair of opposing rod support members 18 and rotated in the same direction by a driving torque generated by a motor 19. The wafer rotating rods 11 preferably have a small diameter by which the transmission of ultrasonic waves is not prevented.

The number of wafer rotating rods 11 is preferably as small as possible. To ensure the frictional force with the wafers 40, however, it is preferable to use two wafer rotating rods 11 for limiting the movement in the rolling direction (x-axis direction) of the wafers 40 and two wafer rotating rods 11 for supporting the wafers 40 from below. By arranging two appropriately spaced wafer rotating rods 11 below wafers, the driving torque can be efficiently transmitted to wafers having orientation flats. This is so because if only one wafer rotating rod 11 is present below the wafer and the orientation flat of the wafer is positioned on this wafer rotating rod 11, the wafer cannot be rotated by the wafer rotating rod 11.

Standing waves, i.e., high- and low-strength portions of ultrasonic waves are usually formed between the bottom surface of the wafer processing bath 10 and the liquid surface. In this wafer processing apparatus 100, however, the nonuniformity of the processing resulting from standing waves is decreased because the wafers 40 can be processed while being rotated.

This wafer processing apparatus 100 has a structure in which members on the bottom portion of the wafer processing bath 10 and around the wafers 40 are removed as many as possible. Accordingly, the supply of ultrasonic waves to the wafers 40 can be made efficient and uniform. Also, this structure allows the processing solution near the wafers 40 to freely flow. This makes the processing for the wafers uniform and prevents the occurrence of a processing failure.

Figure 3:
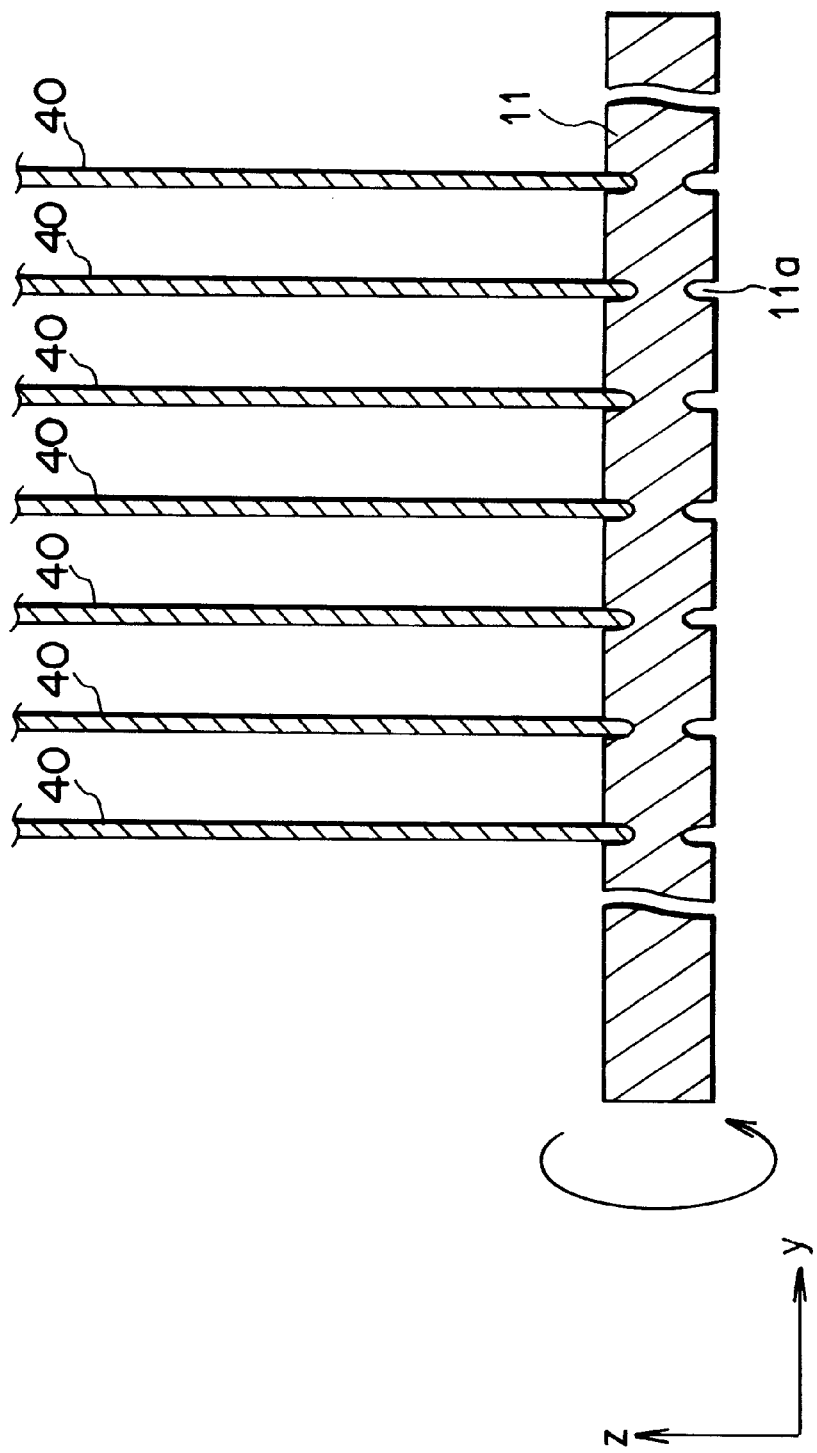
FIG. 3 is a sectional shape showing the shape of a wafer rotating rod.

FIG. 3 is a sectional view showing the shape of the wafer rotating rod 11. The wafer rotating rod 11 has a plurality of grooves 11a for supporting the beveling of the wafer 40 by clamping it. The shape of the grooves 11a is preferably a U shape or a V shape. In this wafer processing apparatus, no specific region of the beveling of the wafer 40 is constantly supported because the wafer rotating rod 11 supports the wafer 40 while rotating it. Accordingly, the beveling of the wafer 40 can also be uniformly processed.

Figure 4:
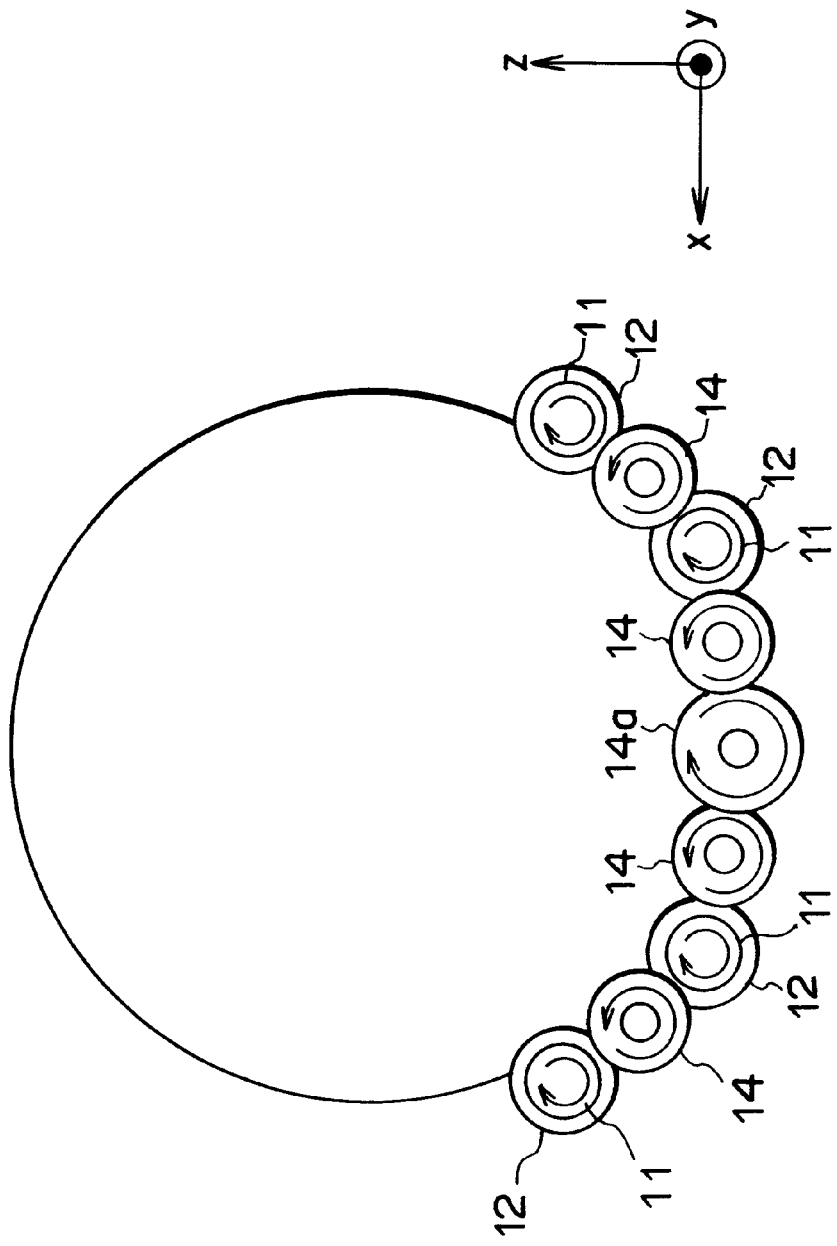
FIG. 4 is a view showing an outline of the construction of a wafer rotating mechanism.
Figure 5:
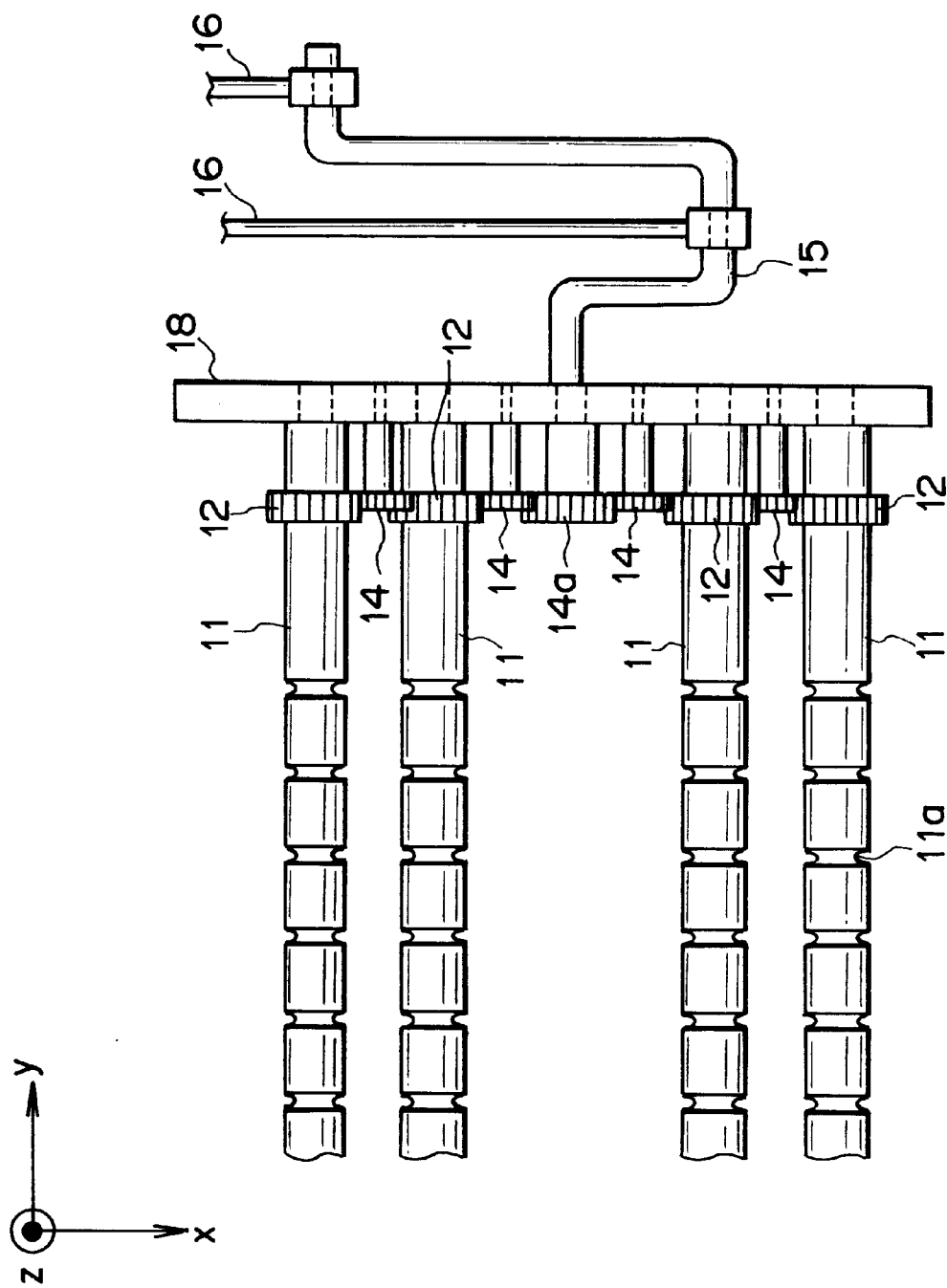
FIG. 5 is a view showing an outline of the construction of the wafer rotating mechanism.

FIGS. 4 and 5 are views showing an outline of the construction of the wafer rotating mechanism. The four wafer rotating rods 11 are arranged parallel to each other in the horizontal direction (y-axis direction) so as to extend along a columnar shape formed by the wafers 40. A driving force transmission gear 12 is provided near the end portion of each wafer rotating rod 11. A driving torque generated by the motor 19 is transmitted to a crank 15 via a crank 17 and a connecting rod 16. A driving force transmission gear 14a is provided at the end portion of the crank 15. The driving torque transmitted to the driving force transmission gear 14a is transmitted to the driving force transmission gears 12 via intermediate gears 14. By this arrangement, the wafer rotating rods 11 rotate in the same direction at the same speed.

In the embodiment shown in FIGS. 4 and 5, the driving torque generated by the motor 19 is transmitted to the crank 15 and distributed to the wafer rotating rods 11 in order to simplify the construction. However, cranks can also be provided in a one-to-one correspondence with the wafer rotating rods 11. If this is the case, it is unnecessary to provide the driving force transmission gears 12 and 14a and the intermediate gear 14. Consequently, the production of particles resulting from the friction of the gears can be prevented.

It is not always necessary to simultaneously rotate the four wafer rotating rods 11. To efficiently transmit the rotating force to the wafers 40, however, it is preferable to rotate at least one wafer rotating rod 11 below the wafers 40. Furthermore, to more efficiently transmit the rotating force to the wafers 40 or to smoothly rotate wafers having orientation flats, it is preferable to rotate the two wafer rotating rods 11 below the wafers 40.

The wafer rotating mechanism is not restricted to the above construction. That is, any mechanism can be used as long as the mechanism can rotate the wafer rotating rods 11 in the same direction. For example, it is also possible to use a construction which transmits the driving force of the motor 19 to the driving force transmission gear 14a by a bevel gear or a belt.

In this wafer processing apparatus 100, supply ports 21c for supplying the processing solution to the wafer processing bath 10 are arranged near the bottom portion of the wafer processing bath 10 so that the processing solution circulates upward from the bottom portion of the wafer processing bath 10. Furthermore, in this wafer processing apparatus 10, a plurality of supply ports 21c are arranged near the wafers 40 to adjust the flowing direction of the processing solution, so that the processing solution near the driving force transmitting mechanism constituted by the gears 12, 14, and 14a, the crank 15, the connecting rod 16, and the like does not move to the wafers 40. This reduces the possibility of the wafers 40 being contaminated by particles that may be produced by the friction of the driving force transmitting mechanism.

Some other means can also be used to prevent the contamination of wafers by particles which may be produced by the driving force transmitting mechanism. For example, it is effective to adjust the diameter of each supply port 21c or to form a partition for separating the wafers 40 and the driving force transmitting mechanism.

Figure 6:
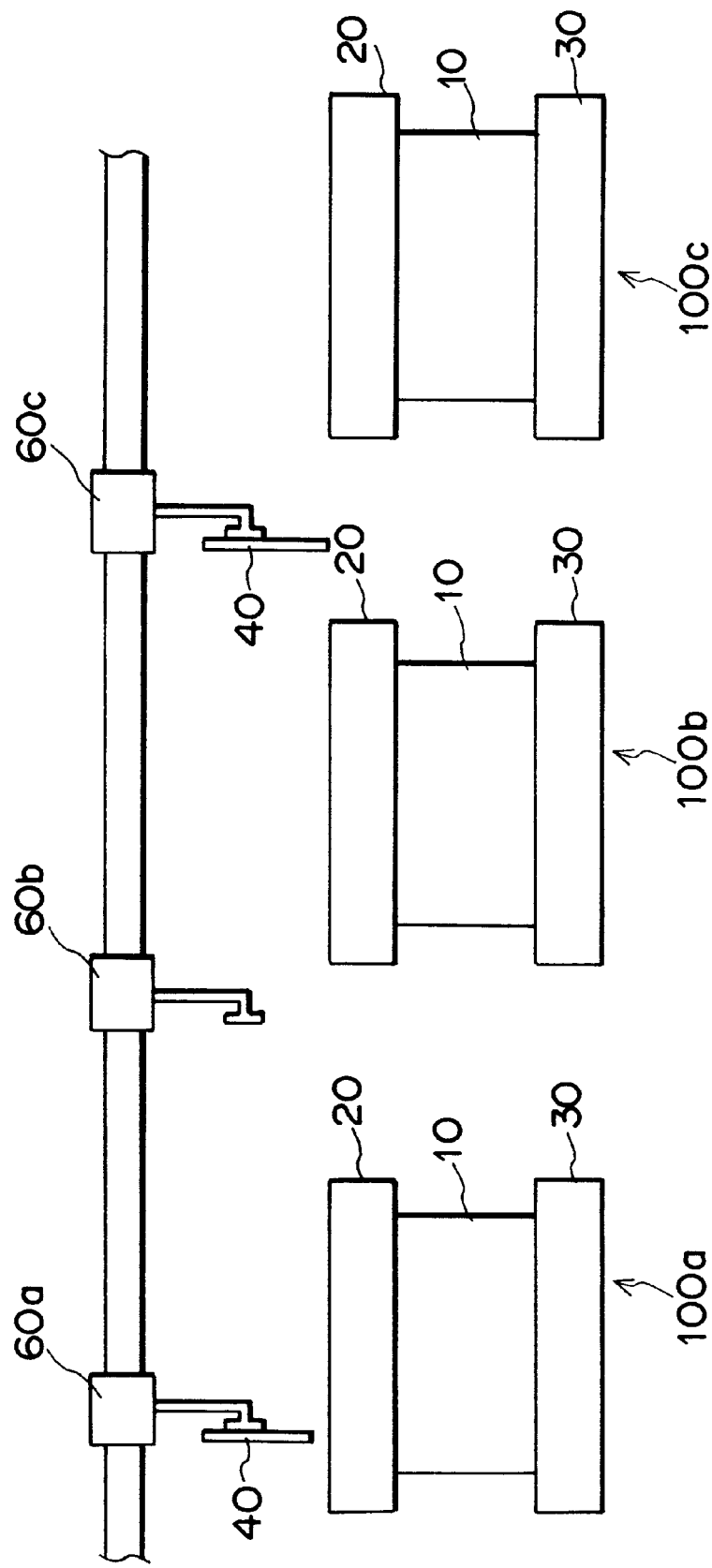
FIG. 6 is a view schematically showing the arrangement of a wafer processing system in which a plurality of wafer processing apparatuses are arranged.

FIG. 6 is a view schematically showing the arrangement of a wafer processing system in which a plurality of wafer processing apparatuses are arranged. Wafer processing apparatuses 100a to 100c have essentially the same construction as the wafer processing apparatus 100 described above. In this embodiment, the apparatuses 100a and 100c are used as cleaning apparatuses, and the apparatus 100b is used as an etching apparatus.

Each of single wafer transfer robots 60a to 60c holds a wafer by vacuum-chucking the rear surface of the wafer. Under the control of a computer, the transfer robot 60a vacuum-chucks a wafer 40 completely processed in the preceding step, transfers the wafer 40 to the cleaning apparatus 100a, and sets the wafer 40 so that the wafer fits in corresponding grooves 11a of wafer rotating rods 11 of the cleaning apparatus 100a. When a predetermined number of wafers 40 are set in a wafer processing bath 10, the cleaning apparatus 100a executes cleaning processing while rotating the wafer rotating rods 11 under the computer control.

When the cleaning apparatus 100a completely cleans the wafers 40, under the computer control the transfer robot 60b vacuum-chucks the wafer 40 in the wafer processing bath 10 of the cleaning apparatus 100a, transfers the wafer 40 to the etching apparatus 100b as the next wafer processing apparatus, and sets the wafer 40 so that the wafer fits in the corresponding grooves 11a of the wafer rotating rods 11. When a predetermined number of wafers are set in the wafer processing bath 10, the etching apparatus 100b executes etching processing while rotating the wafer rotating rods 11 under the computer control.

When the etching apparatus 10c completely etches the wafers 40, under the computer control the transfer robot 60c vacuum-chucks the wafer 40 in the wafer processing bath 10 of the etching apparatus 100b, transfers the wafer 40 to the cleaning apparatus 100c as the next wafer processing apparatus, and sets the wafer 40 so that the wafer fits in the corresponding grooves 11a of the wafer rotating rods 11. When a predetermined number of wafers are set in the wafer processing bath 10, the cleaning apparatus 100c executes cleaning processing while rotating the wafer rotating rods 11 under the computer control.

Figure 7:
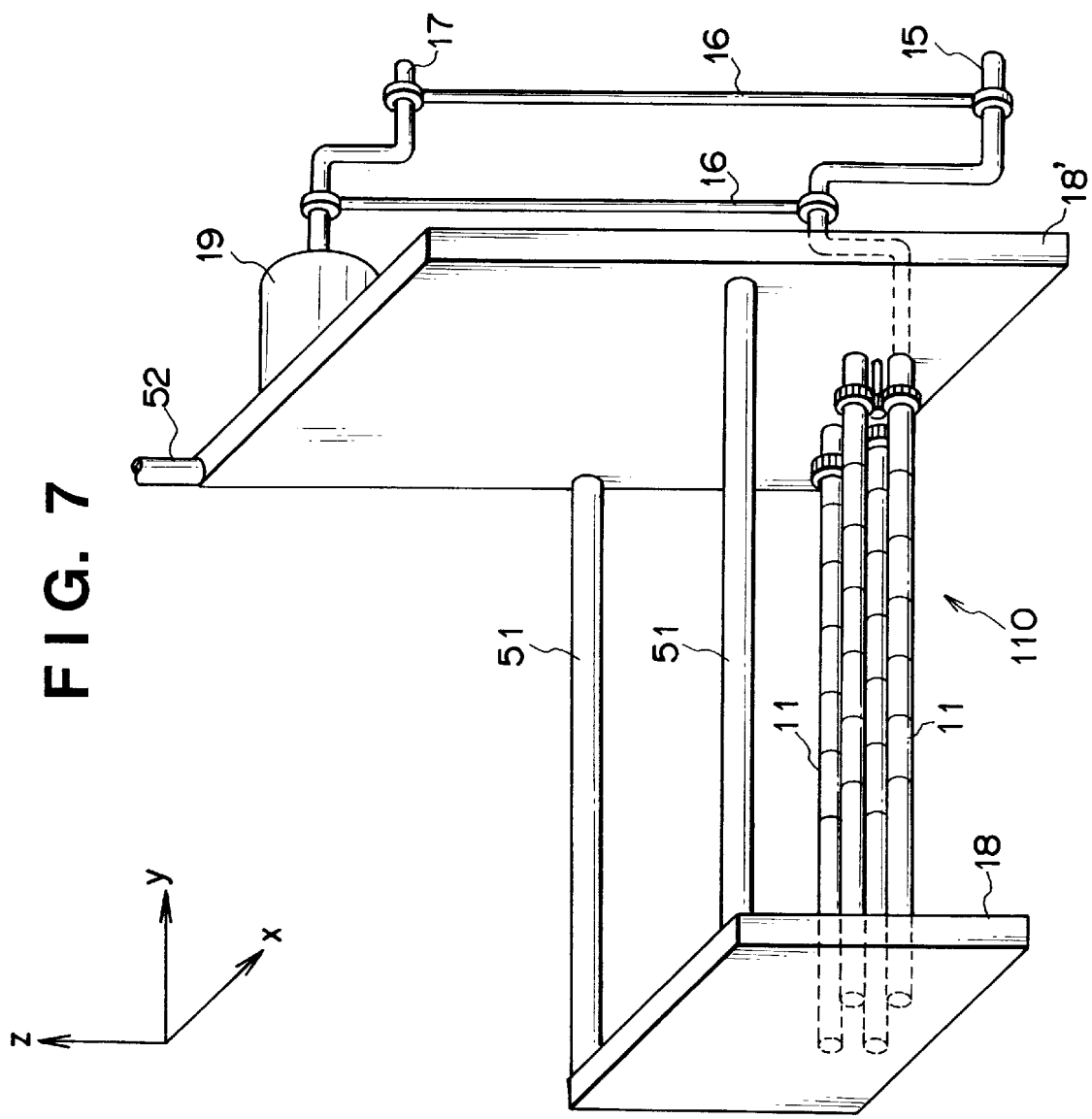
FIG. 7 is a view showing another example of the construction of the wafer rotating mechanism.

FIG. 7 shows another example of the construction of the wafer rotating mechanism. This wafer rotating mechanism 110 has a function of rocking wafer support members in the wafer processing bath 10 and a function of raising the wafer support members to a position above the wafer processing bath 10, thereby enabling loading and unloading of the wafers 40 outside the wafer processing bath 10. The former function can make the processing performed for the wafers 40 more uniform. The latter function facilitates loading and unloading of the wafers 40. With this function, it is also possible to move wafers to another processing bath while the wafers are set in the rotating mechanism.

In this wafer rotating mechanism 110, two rod support members 18 and 18' are connected by connecting members 51. The motor 19 is fixed to the rod support member 18' rather than the overflow bath 20. An arm 52 for moving the wafer rotating mechanism 110 by a robot is attached to the rod support member 18'.

Figure 8:
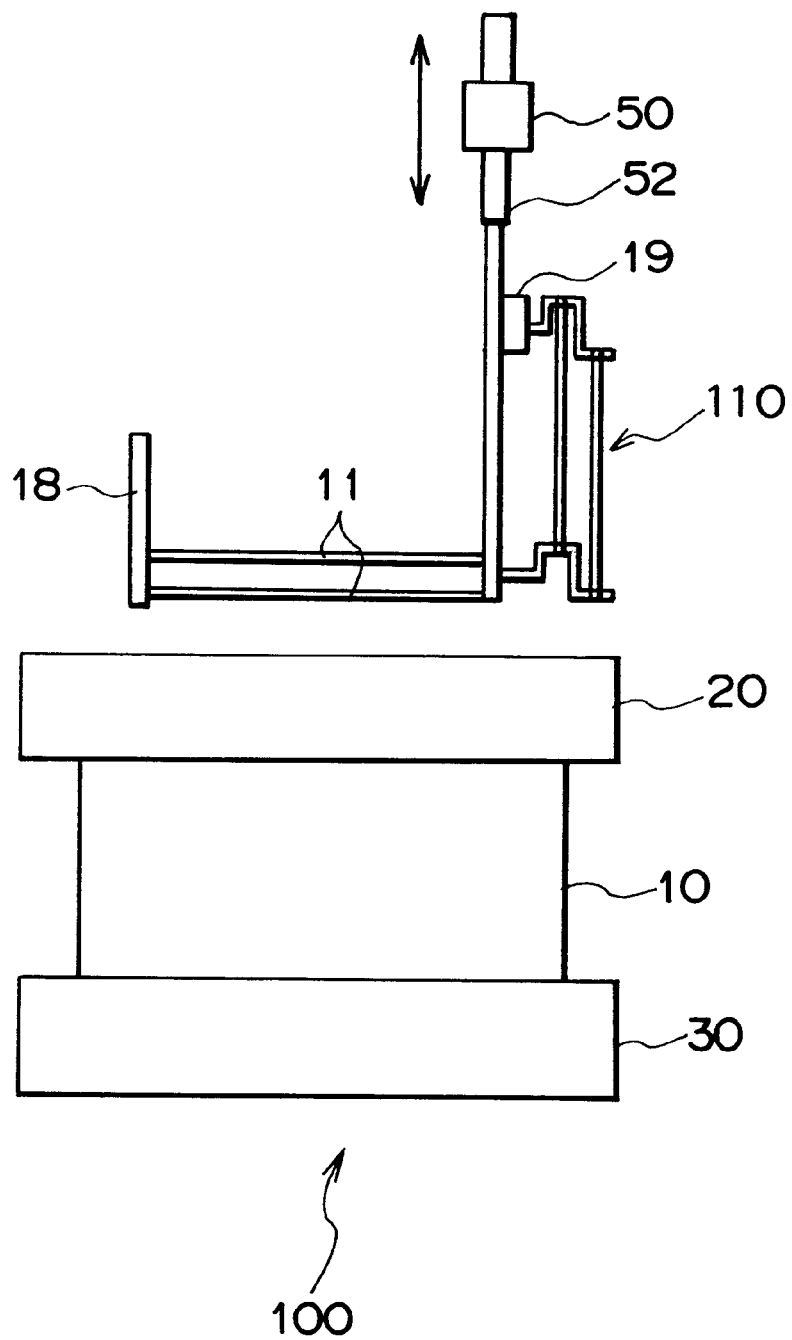
FIG. 8 is a view showing an outline of the construction of a wafer processing apparatus including the wafer rotating mechanism shown in FIG. 7.

FIG. 8 is a view showing an outline of the arrangement of a wafer processing apparatus including the wafer rotating mechanism 110. A robot 50 can sink and raise the wafer rotating mechanism 110 into and from the wafer processing bath 10 under the control of a computer. Therefore, wafers can be set outside the wafer processing bath 10. Also, wafers can be moved to another processing bath while being set in a wafer rotating mechanism 110. Additionally, the robot 50 has a function of vertically and horizontally rocking the wafer rotating mechanism 110 in the wafer processing bath 10. With this function the processing performed for wafers can be made more uniform.

Examples of the wafer processing performed by the wafer processing apparatus 100 will be described below.

EXAMPLE 1

This example is directed to cleaning processing.

Wafers were set in the wafer processing bath 10 filled with ultrapure water, and ultrasonic waves of about 1 MHz were applied to clean the wafers while the wafers were rotated. By this cleaning, 90% or more of particles on the wafer surfaces were removed. Also, this removal of particles was done uniformly on the wafer surface.

EXAMPLE 2

This example concerns cleaning processing using a solution mixture of ammonia, hydrogen peroxide, and pure water. Cleaning using this solution mixture is suited to particle removal from the surface of a silicon wafer.

Silicon wafers were set in the wafer processing bath 10 filled with a solution mixture of ammonia, hydrogen peroxide, and pure water at about 80° C. While the wafers were rotated, ultrasonic waves of about 1 MHz were applied to clean the wafers. By this cleaning, 95% or more of particles were removed from the wafer surfaces. Also, this removal of particles was done uniformly on the wafer surface.

EXAMPLE 3

This example pertains to etching of a silicon layer.

Silicon wafers were set in the wafer processing bath 10 filled with a solution mixture prepared by mixing hydrofluoric acid, nitric acid, and acetic acid at a ratio of 1:200:200. While the wafers were rotated, ultrasonic waves of about 0.5 MHz were applied to etch the wafer surfaces for 30 sec. Consequently, the silicon wafers were uniformly etched by about 1.0 $\mu$m. The uniformity of the etching rate was ±5% or less on the wafer surface and between the wafers.

EXAMPLE 4

This example relates to etching of an $SiO_2$ layer. Hydrofluoric acid is suitable for the etching of an $SiO_2$ layer.

Wafers on which an $SiO_2$ layer was formed were set in the wafer processing bath 10 filled with 1.2% hydrofluoric acid. While the wafers were rotated, ultrasonic waves of about 0.5 MHz were applied to etch the $SiO_2$ layer for 30 sec. Consequently, the $SiO_2$ layer was uniformly etched by about 4 nm. The uniformity of the etching rate was ±3% or less on the wafer surface and between the wafers.

EXAMPLE 5

This example is about to etching of an $Si_3N_4$ layer. Hot concentrated phosphoric acid is suitable for the etching of an $Si_3N_4$ layer.

Wafers on which an $Si_3N_4$ layer was formed were set in the wafer processing bath 10 filled with hot concentrated phosphoric acid. While the wafers were rotated, ultrasonic waves of about 0.5 MHz were applied to etch the $Si_3N_4$ layer. Consequently, the $Si_3N_4$ layer was uniformly etched by about 100 nm. The uniformity of the etching rate was ±3% or less on the wafer surface and between the wafers.

EXAMPLE 6

This example exemplifies to etching of a porous silicon layer. A solution mixture of hydrofluoric acid, hydrogen peroxide, and pure water is suitable for the etching of a porous silicon layer.

Wafers having a porous silicon layer were set in the wafer processing bath 10 filled with a solution mixture of hydrofluoric acid, hydrogen peroxide, and pure water. While the wafers were rotated, ultrasonic waves of about 0.25 MHz were applied to etch the porous silicon layer. Consequently, the porous silicon layer was uniformly etched by 5 $\mu$m. The uniformity of the etching rate was ±3% or less on the wafer surface and between the wafers.

Note that the mechanism of etching of porous silicon is disclosed in K. Sakaguchi et al., Jpn. Appl. Phys. Vol.34, part 1, No. 2B, 842–847 (1995). According to this reference, porous silicon is etched when an etching solution penetrates into the pores of porous silicon by a capillary action and etches the walls of the pores. As the walls of the pores become thinner, these walls cannot support themselves beyond some point. Finally, the porous layer entirely collapses to complete the etching.

EXAMPLE 7

This example concerns an SOI wafer fabrication method. FIGS. 9A to 9F are sectional views showing the steps of the SOI wafer fabrication method according to this example.

Figure 9A:
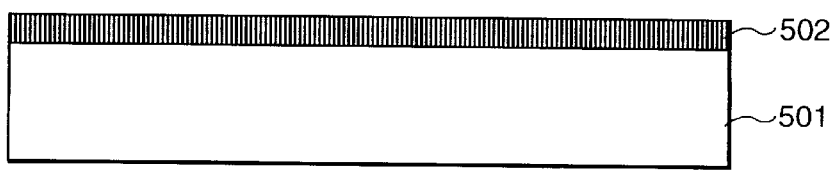
FIGS. 9A to 9F are sectional views showing the steps of an SOI wafer fabrication method.

First, a single-crystal Si substrate 501 for forming a first substrate was anodized in an HF solution to form a porous Si layer 502 (FIG. 9A). The anodization conditions were as follows.

Current density: 7 (mA/cm$^2$)
Anodizing solution: HF:H$_2$O:C$_2$H$_5$OH=1:1:1
Time: 11 (min)
Porous Si thickness: 12 ($\mu$m)

Subsequently, the resultant substrate was allowed to oxidize in an oxygen atmosphere at 400° C. for 1 h. By this oxidation, the inner walls of pores of the porous Si layer 502 were covered with a thermal oxide film.

Figure 9B:
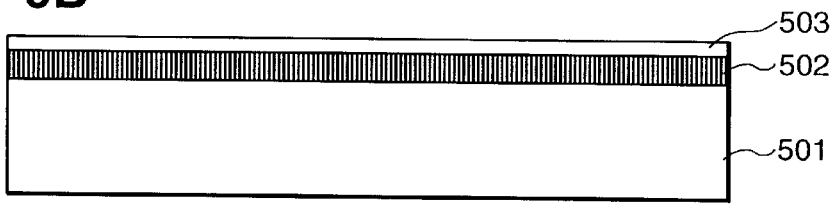

A 0.30-$\mu$m thick single-crystal Si layer 503 was epitaxially grown on the porous Si layer 502 by a CVD (Chemical Vapor Deposition) process (FIG. 9B). The epitaxial growth conditions were as follows.

Source gas: SiH$_2$Cl$_2$/H$_2$
Gas flow rates: 0.5/180 (l/min)
Gas pressure: 80 (Torr)
Temperature: 950 (° C.)
Growth rate: 0.3 ($\mu$m/min)

Figure 9C:
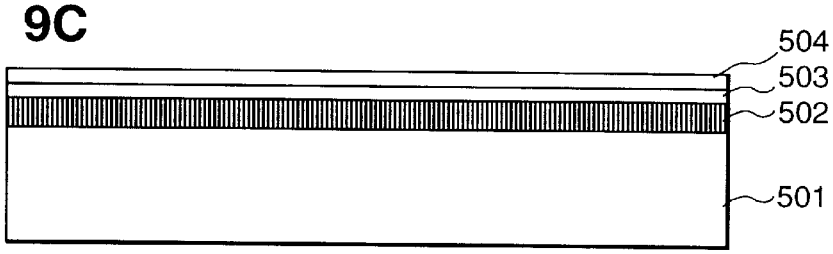

Next, a 200-nm thick SiO$_2$ layer 504 was formed on the single-crystal Si layer (epitaxial layer) 503 by thermal oxidation (FIG. 9C).

Figure 9D:
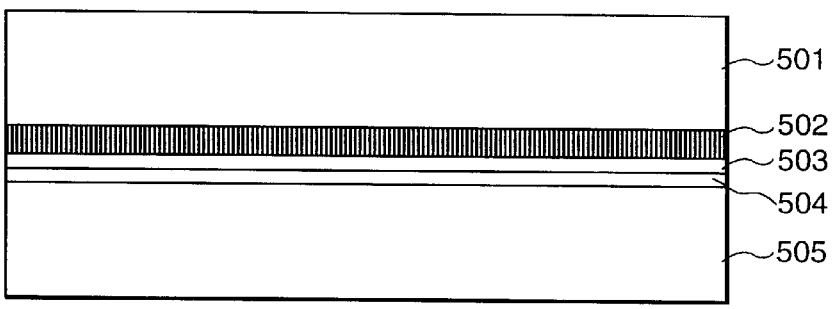

The first substrate thus formed as shown in FIG. 9C and an Si substrate 505 as a second substrate were so adhered as to sandwich the SiO$_2$ layer 504 (FIG. 9D).

Figure 9E:
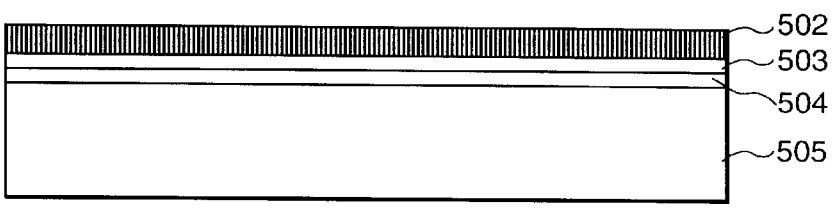

The single-crystal Si substrate 501 was removed from the first substrate to expose the porous Si layer 502 (FIG. 9E).

Figure 9F:

The wafers shown in FIG. 9E were set in the wafer processing bath 10 filled with a solution mixture of hydrofluoric acid, hydrogen peroxide, and pure water. While the wafers were rotated, ultrasonic waves of about 0.25 MHz were applied to etch the porous Si layer 502 (FIG. 9F). The uniformity of the etching rate of the porous Si layer 502 was ±5% or less on the wafer surface and between the wafers. By applying ultrasonic waves while wafers are rotated as described above, it is possible to uniformly promote the collapse (etching) of porous Si on the wafer surface and between the wafers.

In the etching of the porous Si layer 502, the single-crystal Si layer (epitaxial layer) 503 functions as an etching stop layer. Therefore, the porous Si layer 502 is selectively etched on the entire surface of the wafer.

That is, the rate at which the single-crystal Si layer 503 is etched by the etching solution described above is very low, so the etching selectivity of the porous Si layer 502 to the single-crystal Si layer 503 is 10$^5$ or more. Accordingly, the etching amount of the single-crystal Si layer 503 is about a few tens of Å and practically negligible.

FIG. 9F shows the SOI wafer obtained by the above steps. This SOI wafer has the 0.2-$\mu$m thick single-crystal Si layer 503 on the SiO$_2$ layer 504. The film thickness of this single-crystal Si layer 503 was measured at one hundred points over the entire surface and found to be 201 nm±4 nm.

In this example, a heat treatment was further performed in a hydrogen atmosphere at 1100° C. for about 1 h. When the surface roughness of the resultant SOI wafers was evaluated with an atomic force microscope (AFM), the root-mean-square of the surface roughness in a square region of 5 $\mu$m side was about 0.2 nm. This quality is equivalent to that of common Si wafers on the market.

Also, after the above heat treatment the cross-sections of the SOI wafers were observed with a transmission electron microscope. As a consequence, no new crystal defects were produced in the single-crystal Si layer 503, indicating that high crystallinity was maintained.

It is possible to form an SiO$_2$ film on the single-crystal Si film (epitaxial layer) 503 of the first substance as described above, on the surface of the second substrate 505, or on both. In any of these cases, results similar to these described above were obtained.

Furthermore, even when a light-transmitting wafer such as a quartz wafer was used as the second substrate, a high-quality SOI wafer could be formed by the above fabrication steps. However, the heat treatment in the hydrogen atmosphere was performed at a temperature of 1000° C. or less in order to prevent slip in the single-crystal Si layer 503 caused by the difference between the thermal expansion coefficients of the quartz (second substrate) and the single-crystal Si layer 503.

EXAMPLE 8

This example is directed to another SOI wafer fabrication method. Fabrication steps which can be expressed by drawings are the same as those shown in FIGS. 9A to 9F, so the method will be described below with reference to FIGS. 9A to 9F.

First, a single-crystal Si substrate 501 for forming a first substrate was anodized in an HF solution to form a porous Si layer 502 (FIG. 9A). The anodization conditions were as follows.

First Stage
Current density: 7 (mA/cm$^2$)
Anodizing solution: HF:H$_2$O:C$_2$H$_5$OH=1:1:1
Time: 5 (min)
Porous Si thickness: 5.5 ($\mu$m)

Second Stage
Current density: 21 (mA/cm$^2$)
Anodizing solution: HF:H$_2$O:C$_2$H$_5$OH=1:1:1
Time: 20 (sec)
Porous Si thickness: 0.5 ($\mu$m)

Subsequently, the resultant substrate was allowed to oxidize in an oxygen atmosphere at 400° C. for 1 h. By this oxidation, the inner walls of pores of the porous Si layer 502 were covered with a thermal oxide film.

A 0.15-$\mu$m thick single-crystal Si layer 503 was epitaxially grown on the porous Si layer 502 by a CVD (Chemical Vapor Deposition) process (FIG. 9B). The epitaxial growth conditions were as follows.

Source gas: SiH$_2$Cl$_2$/H$_2$
Gas flow rates: 0.5/180 (l/min)
Gas pressure: 80 (Torr)
Temperature: 950 (° C.)
Growth rate: 0.3 ($\mu$m/min)

Next, a 100-nm thick SiO$_2$ layer 504 was formed on the single-crystal Si layer (epitaxial layer) 503 by oxidation (FIG. 9C).

The first substrate thus formed as shown in FIG. 9C and a second Si substrate 505 were so adhered as to sandwich the SiO$_2$ layer 504 (FIG. 9D).

The adhered wafers was separated into two wafers from the porous Si layer formed at a current density of 21 mA/cm² (second stage), thereby exposing the porous Si layer 503 to the surface of the second substrate 505 (FIG. 9E). Examples of the method of separating the adhered wafers are 1) mechanically pulling the two substrates, 2) twisting the substrates, 3) pressurizing the substrates, 4) driving a wedge between the substrates, 5) peeling the substrates by oxidizing from their end faces, 6) using thermal stress, and 7) applying ultrasonic waves, and it is possible to selectively use any of these methods.

The wafers shown in FIG. 9E were set in the wafer processing bath 10 filled with a solution mixture of hydrofluoric acid, hydrogen peroxide, and pure water. While the wafers were rotated, ultrasonic waves of about 0.25 MHz were applied to etch the porous Si layer 502 (FIG. 9F). The uniformity of the etching rate of the porous Si layer 502 was ±5% or less on the wafer surface and between the wafers. By applying ultrasonic waves while wafers are rotated as described above, it is possible to uniformly promote the collapse (etching) of porous Si on the wafer surface and between the wafers.

In the etching of the porous Si layer 502, the single-crystal Si layer (epitaxial layer) 503 functions as an etching stop layer. Therefore, the porous Si layer 502 is selectively etched on the entire surface of the wafer.

That is, the rate at which the single-crystal Si layer 503 is etched by the etching solution described above is very low, so the etching selectivity of the porous Si layer 502 to the single-crystal Si layer 503 is $10^5$ or more. Accordingly, the etching amount of the single-crystal Si layer 503 is about a few tens of Å and practically negligible.

FIG. 9F shows the SOI wafer obtained by the above steps. This SOI wafer has the 0.1-$\mu$m thick single-crystal Si layer 503 on the $SiO_2$ layer 504. The film thickness of this single-crystal Si layer 503 was measured at one hundred points over the entire surface and found to be 101 nm±3 nm.

In this example, a heat treatment was further performed in a hydrogen atmosphere at 1100° C. for about 1 h. When the surface roughness of the resultant SOI wafers was evaluated with an atomic force microscope (AFM), the root-mean-square of the surface roughness in a square region of 5 $\mu$m side was about 0.2 nm. This quality is equivalent to that of common Si wafers on the market.

Also, after the above heat treatment the cross-sections of the SOI wafers were observed with a transmission electron microscope. As a consequence, no new crystal defects were produced in the single-crystal Si layer 503, indicating that high crystallinity was maintained.

It is possible to form an $SiO_2$ film on the single-crystal Si film (epitaxial layer) 503 of the first substrate as described above, on the surface of the second substrate 505, or on both. In any of these cases, results similar to these described above were obtained.

Furthermore, even when a light-transmitting wafer such as a quartz wafer was used as the second substrate, a high-quality SOI wafer could be formed by the above fabrication steps. However, the heat treatment in the hydrogen atmosphere was performed at a temperature of 1000° C. or less in order to prevent slip in the single-crystal Si layer 503 caused by the difference between the thermal expansion coefficients of the quartz (second substrate) and the single-crystal Si layer 503.

In this example, the first substrate (to be referred to as the separated substrate hereinafter) obtained by separating the adhered wafers into two wafers can be reused. That is, the separated substrate can be reused as the first or second substrate by selectively etching the porous Si film remaining on the surface of the substrate by the same etching method as for the porous Si film described above and processing the resultant material (e.g., annealing in a hydrogen processing or a surface treatment such as surface polishing).

In examples 7 and 8 described above, epitaxial growth is used to form a single-crystal Si layer on a porous Si layer. However, it is also possible to use other various methods such as CVD, MBE, sputtering, and liquid phase growth in the formation of a single-crystal Si layer.

Also, a semiconductor layer of a single-crystal compound such as GaAs or InP can be formed on a porous Si layer by epitaxial growth. If this is the case, wafers suited to high-frequency devices such as "GaAs on Si" and "GaAs on Glass (Quartz)" and OEIC can be made.

Furthermore, although a solution mixture of 49% hydrofluoric acid and 30% hydrogen peroxide is suitable for an etching solution for selectively etching a porous Si layer, the following etching solutions are also suited. This is so because porous Si has an enormous surface area and hence can be readily selectively etched.

(a) hydrofluoric acid
(b) solution mixture prepared by adding at least one of alcohol and hydrogen peroxide to hydrofluoric acid
(c) buffered hydrofluoric acid
(d) solution mixture prepared by adding at least one of alcohol and hydrogen peroxide to buffered hydrofluoric acid
(e) solution mixture of hydrofluoric acid, nitric acid, and acetic acid Note that the other fabrication steps are not limited to the conditions in the above examples, and so other various conditions can be used.

The present invention can make wafer processing uniform.

The present invention is not limited to the above embodiments and various changes and modifications can be made within the spirit and scope of the present invention. Therefore, to apprise the public of the scope of the present invention the following claims are made.

What is claimed is:

1. A wafer processing apparatus for processing a wafer by dipping the wafer into a processing solution, comprising:
   a wafer processing bath;
   a rotary support mechanism for supporting and holding a wafer substantially perpendicular to a bottom surface of said wafer processing bath and rotating the wafer by at least three rotatable and horizontal rod members arranged substantially parallel to each other and situated at positions below, but not directly below, a center of the wafer, each of the rod members having a plurality of grooves for supporting a beveling of the wafer by clamping the beveling and at least one of the rod members supporting the wafer from below; and
   an ultrasonic supply situated below the wafer for applying ultrasonic waves to the wafer.

2. The apparatus according to claim 1, wherein said rotary support mechanism applies a rotating force to a wafer by rotating said at least three rotatable rod members, which support the wafer from a bottom surface side of said processing bath.

3. The apparatus according to claim 1, wherein said rotary support mechanism applies a rotating force to a wafer by rotating said rod members in the same direction.

4. The apparatus according to claim 1, wherein said rotary support mechanism comprises driving force generating means for generating a driving force for rotating a wafer outside said processing bath.

5. The apparatus according to claim 4, wherein said rotary support mechanism further comprises a crank mechanism for transmitting the driving force generated by said driving force generating means to said rod members.

6. The apparatus according to claim 1, further comprising a driving mechanism for rocking said rotary support mechanism in said processing bath.

7. The apparatus according to claim 1, further comprising a driving mechanism for floating or dipping said rotary support mechanism.

8. The apparatus according to claim 1, wherein said processing bath comprises a circulating mechanism including an overflow bath.

9. The apparatus according to claim 8, wherein said circulating mechanism comprises means for reducing contamination of a wafer caused by particles which may be produced by said rotary support mechanism.

10. The apparatus according to claim 1, wherein said ultrasonic supply comprises an ultrasonic bath, an ultrasonic source, and an adjusting mechanism for adjusting a position of said ultrasonic source in said ultrasonic bath, and ultrasonic waves are transmitted to said processing bath via an ultrasonic transmitting medium placed in said ultrasonic bath.

11. The apparatus according to claim 1, wherein at least portions of said processing bath and said rotary support mechanism, which may come into contact with a processing solution, are made of a material selected from the group consisting of quartz and plastic.

12. The apparatus according to claim 1, wherein at least portions of said processing bath and said rotary support mechanism, which may come into contact with a processing solution, are made of a material selected from the group consisting of a fluorine resin, vinyl chloride, polyethylene, polypropylene, polybutyleneterephthalate (PBT), and polyetheretherketone (PEEK).

13. The apparatus according to claim 1, wherein said rotary support mechanism supports a wafer by four rod members.

14. The apparatus according to claim 1, wherein said rod members are arranged in a position where rotation of a wafer having an orientation flat is not prevented by the orientation flat when the wafer is processed.

15. A wafer processing method of processing a wafer by using the apparatus according to claim 1.

16. A wafer processing method of etching a specific layer formed on a wafer by using the apparatus according to claim 1.

17. An SOI wafer fabrication method of fabricating an SOI wafer by using the method according to claim 16 in a part of fabrication steps.

18. A wafer processing apparatus for processing a wafer by dipping the wafer into a processing solution, comprising:
a wafer processing bath;
support means for supporting a wafer from both sides and below by at least three rotatable and horizontal rod members, situated at positions below, but not directly below, a center of the wafer, to hold the wafer substantially perpendicular to a bottom surface of said processing bath, each of the rod members having a plurality of grooves for supporting a beveling of the wafer by clamping the beveling;
driving means for rotating the supported wafer by rotating at least one of the rod members; and
an ultrasonic supply situated below the wafer for applying ultrasonic waves to the wafer.

19. The apparatus according to claim 18, wherein said driving means applies a rotating force to a wafer by rotating said at least three rotatable rod members.

20. A wafer processing apparatus for processing a wafer by dipping the wafer into a processing solution, comprising:
a wafer processing bath;
a rotary support mechanism for supporting a wafer in said wafer processing bath while rotating the wafer by a plurality of rod members arranged substantially parallel to each other; and ultrasonic generating means, located below the wafer, for generating ultrasonic waves in said processing bath, wherein said plurality of rod members includes four rod members with two wafer rotating rods for limiting the movement in a rolling direction of the wafer and two wafer rotating rods for supporting the wafer from below, each of the four wafer rotating rods being situated at positions below, but not directly below, a center of the wafer, and each of the four wafer rotating rods having a plurality of grooves for supporting the wafer by clamping a beveling of the wafer.

21. The apparatus according to claim 20, wherein said rotary support mechanism applies a rotating force to a wafer by rotating said rod members in the same direction.

22. The apparatus according to claim 20, wherein said rotary support mechanism comprises driving force generating means for generating a driving force for rotating a wafer outside said processing bath.

23. The apparatus according to claim 22, wherein said rotary support mechanism further comprises a crank mechanism for transmitting the driving force generated by said driving force generating means to said plurality of rod members.

24. The apparatus according to claim 20, further comprising a driving mechanism for rocking said rotary support mechanism in said processing bath.

25. The apparatus according to claim 20, further comprising a driving mechanism for floating or dipping said rotary support mechanism.

26. The apparatus according to claim 20, wherein said processing bath comprises a circulating mechanism including an overflow bath.

27. The apparatus according to claim 26, wherein said circulating mechanism comprises means for reducing contamination of wafer caused by particles which may be produced by said rotary support mechanism.

28. The apparatus according to claim 20, wherein said ultrasonic generating means comprises an ultrasonic bath, an ultrasonic source, and an adjusting mechanism for adjusting a position of said ultrasonic source in said ultrasonic bath, and ultrasonic waves are transmitted to said processing bath via an ultrasonic transmitting medium placed in said ultrasonic bath.

29. The apparatus according to claim 20, wherein at least portions of said processing bath and said rotary support mechanism, which may come into contact with a processing solution are made of a material selected from the group consisting of quartz and plastic.

30. The apparatus according to claim 20, wherein at least portions of said processing bath and said rotary support mechanism, which may come into contact with a processing solution, are made of a material selected from the group consisting of a fluorine resin, vinyl chloride, polyethylene, polypropylene, polybutyleneterephthalate (PBT) and polyetheretherketone (PEEK).

31. A wafer processing method of processing a wafer by dipping the wafer into a processing solution, wherein a wafer is rotated while being supported from two sides and below by at least three rotatable and horizontal rod members situated at positions below, but not directly below, a center of the wafer, each of the rod members having a plurality of grooves for supporting a beveling of the wafer by clamping the beveling, the wafer being held substantially perpendicular to a bottom surface of a processing bath and ultrasonic waves being applied to the wafer by an ultrasonic supply situated below the wafer.

32. The method according to claim 31, wherein a wafer is etched by using an etching solution as the processing solution.

33. The method according to claim 31, wherein a wafer having a porous silicon layer is etched by using an etching solution as the processing solution.

34. An SOI wafer fabrication method of fabricating in SOI wafer by using the method according to claim 33 in a part of fabrication steps.

* * * * *

UNITED STATES PATENT AND TRADEMARK OFFICE
CERTIFICATE OF CORRECTION

PATENT NO.    : 6,337,030 B1
DATED         : January 8, 2002
INVENTOR(S)   : Sakaguchi It is certified that error appears in the above-identified patent and that said Letters Patent is hereby corrected as shown below:

<u>Title page,</u>
Item [56], FOREIGN PATENT DOCUMENTS, insert therefor -- JPA 5-343377 --

<u>Column 16,</u>
Line 7, delete "fabricating in SOI" and insert therefor -- fabricating an SOI --

Signed and Sealed this

Twelfth Day of November, 2002

Attest:

Attesting Officer

JAMES E. ROGAN
*Director of the United States Patent and Trademark Office*